United States Patent
Hur et al.

(10) Patent No.: US 10,854,309 B2
(45) Date of Patent: Dec. 1, 2020

(54) MEMORY SYSTEM AND OPERATING METHOD THEREOF

(71) Applicant: SK hynix Inc., Gyeonggi-do (KR)

(72) Inventors: Se Kyoung Hur, Gyeonggi-do (KR);
Kwang Seok Im, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/703,432

(22) Filed: Dec. 4, 2019

(65) Prior Publication Data

US 2020/0321069 A1  Oct. 8, 2020

(30) Foreign Application Priority Data

Apr. 2, 2019  (KR) .......................... 10-2019-0038719

(51) Int. Cl.
| | | |
|---|---|---|
| *G11C 29/12* | (2006.01) | |
| *G11C 11/4091* | (2006.01) | |
| *G11C 11/406* | (2006.01) | |
| *G11C 29/10* | (2006.01) | |

(52) U.S. Cl.
CPC .......... *G11C 29/12* (2013.01); *G11C 11/4091* (2013.01); *G11C 11/40607* (2013.01); *G11C 29/10* (2013.01)

(58) Field of Classification Search
None
See application file for complete search history.

(56) References Cited

U.S. PATENT DOCUMENTS

| | | | | |
|---|---|---|---|---|
| 6,633,504 B1* | 10/2003 | Lee | ....................... | G11C 7/1072 365/200 |
| 9,653,145 B1* | 5/2017 | Moon | ................... | G11C 29/028 |
| 2007/0297260 A1* | 12/2007 | Lee | ....................... | G11C 7/1051 365/222 |
| 2010/0180152 A1* | 7/2010 | Kasuga | ............. | G11C 11/40618 714/5.11 |
| 2013/0016574 A1* | 1/2013 | Kim | ................. | G11C 29/50016 365/189.07 |

FOREIGN PATENT DOCUMENTS

| | | |
|---|---|---|
| KR | 10-2003-0050744 | 6/2003 |
| KR | 10-2006-0060965 | 6/2006 |

* cited by examiner

*Primary Examiner* — Tan T. Nguyen
(74) *Attorney, Agent, or Firm* — IP & T Group LLP

(57) ABSTRACT

A memory system and an operating method thereof are provided. The memory system includes a storage device including a mode register suitable for activating or inactivating an auto mode and a memory suitable for storing data, and a storage device controller controlling the mode register to enter a test mode, after inactivating the auto mode, during a test operation of the storage device, and controlling the mode register to activate the auto mode again when the test operation of the storage device is completed.

19 Claims, 5 Drawing Sheets

MEMORY SYSTEM AND OPERATING METHOD THEREOF

CROSS-REFERENCE TO RELATED APPLICATION

The present application claims priority under 35 U.S.C. § 119(a) to Korean patent application number 10-2019-0038719, filed on Apr. 2, 2019, which is incorporated herein by reference in its entirety.

BACKGROUND

Field of Invention

Various embodiments of the present disclosure generally relate to a memory system and an operating method thereof. More particularly, the embodiments relate to a memory system that performs a test operation itself, and an operating method thereof.

Description of Related Art

Recently, as miniaturization of a memory system is needed, research on the miniaturization of a memory system has been actively conducted. For example, System On Chip (SOC) technology that incorporates a plurality of semiconductor devices into a single semiconductor chip, and System In Package (SIP) technology that packages a plurality of semiconductor chips into a single semiconductor package are often used as a technology to miniaturize a memory system.

Furthermore, a Built In Self Test (BIST) method that performs a test operation in a memory system itself by using SOC or SIP technology is often adopted to efficiently test a plurality of storage devices included in a memory system.

Since a test operation employing the BIST method is performed utilizing a test algorithm in a memory system itself, the test operation is simplified compared to a test operation employing a conventional method that is performed by coupling a memory system to a plurality of external test devices. Accordingly, research has been actively conducted to further improve the BIST method.

SUMMARY

Various embodiments of the present invention are directed to a memory controller capable of improving reliability of a test operation on a storage device and a method of operating the memory controller.

According to an embodiment, a memory system may include a storage device including: a mode register suitable for storing one or more pieces of code for activating or inactivating an auto mode of refresh and precharge operations of the storage device and a test mode; and a memory suitable for storing data; and a storage device controller suitable for controlling the storage device to: inactivate the auto mode; enter the test mode when the auto mode is inactivated; activate the auto mode when the storage device enters the test mode; perform a test operation on the memory during the test mode; inactivate the auto mode when the test operation is completed; exit the test mode; and activate the auto mode.

According to an embodiment, a method of performing an operation of a memory system including a storage device for storing data may include inactivating a refresh mode and a precharge mode; controlling the storage device to enter a test mode when the refresh mode and the precharge mode are inactivated; activating the refresh mode and the precharge mode when the storage device enters the test mode; controlling the storage device to perform a test operation; inactivating the refresh mode and the precharge mode when the test operation is completed; controlling the storage device to exit the test mode; and activating the refresh mode and the precharge mode.

According to an embodiment, a test method of a DRAM device, the test method comprising: controlling the DRAM device to enter a test mode; controlling the DRAM device to perform a test operation thereto during the test mode; and controlling the DRAM device to exit the test mode, wherein the DRAM device temporarily inactivates refresh and precharge operations at the entry into and the exit from the test mode.

DETAILED DESCRIPTION

Advantages and features of the present invention and methods for achieving them will be made clear from embodiments described below in detail with reference to the accompanying drawings. However, they may be embodied in different forms and should not be construed as being limited to the embodiments set forth herein. Rather, these embodiments are provided so that this disclosure will be thorough and complete, and will fully convey the scope of the embodiments to those skilled in the art.

As used herein, singular forms may include the plural forms as well and vice versa, unless the context clearly indicates otherwise. The articles 'a' and 'an' as used in this application and the appended claims should generally be construed to mean 'one or more' unless specified otherwise or clear from context to be directed to a singular form.

It will be understood that when an element is referred to as being "coupled" or "connected" to a certain element, it may be "directly coupled or connected" to the certain element or may be "indirectly coupled or connected" to the certain element, with intervening elements being present therebetween. In the specification, when an element is referred to as "comprising" or "including" a component, it does not exclude other components but may further include other components unless a description to the contrary is specifically pointed out in context.

Figure 1:
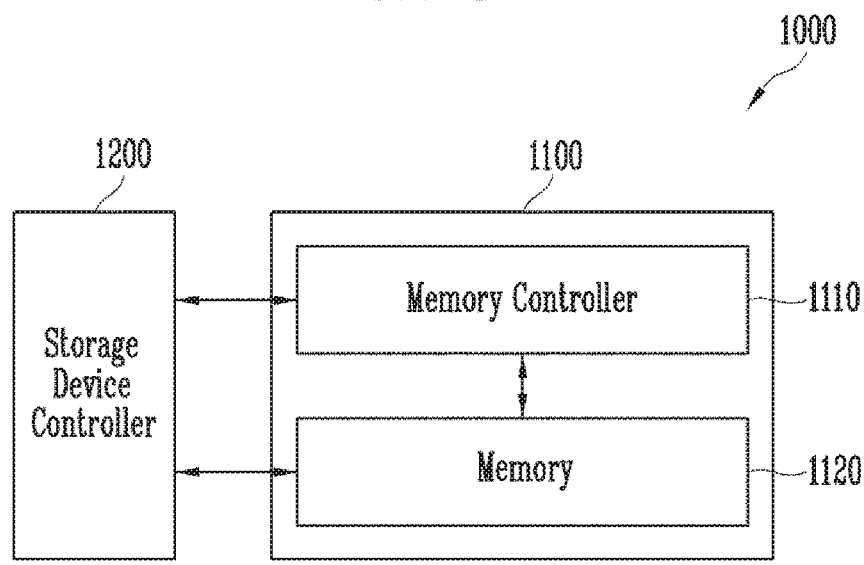
FIG. 1 is a diagram illustrating a memory system according to an embodiment of the present disclosure.

FIG. 1 is a diagram illustrating a memory system 1000 according to an embodiment of the present disclosure.

Referring to FIG. 1, the memory system 1000 may include a storage device 1100 storing data and a storage device controller 1200 controlling the memory device 1100.

The memory system 1000 may be embodied as a volatile memory system or a non-volatile memory system. A volatile memory system loses stored data when a power supply to the memory system is turned off, and a non-volatile memory device retains stored data even in the absence of a power supply. Hereinafter, embodiments of the memory system 1000 which is a volatile memory system will be described.

The storage device 1100 may include a memory controller 1110 and a memory 1120.

The memory controller 1110 may control the memory 1120 to store data input from the storage device controller 1200 or to output the stored data to the storage device controller 1200.

The storage device controller 1200 may control the memory controller 1110 to perform a program, read, or erase operation on the memory 1120. The memory controller 1110 may include a mode register (not illustrated). System information regarding an operation of the storage device 1100 may be stored in the mode register, and the storage device 1100 may be set based on information stored in the mode register. In addition, information corresponding to various modes may be stored in the mode register, and the storage device 1100 may operate according to a mode stored in the mode register. The mode register will be described in more detail in FIG. 3.

The memory controller 1110 may perform a test operation to detect failure of the memory 1120 according to the control of the storage device controller 1200. The memory controller 1110 may change information stored in the mode register according to the control of the storage device controller 1200 to improve reliability of the test operation.

Figure 2:
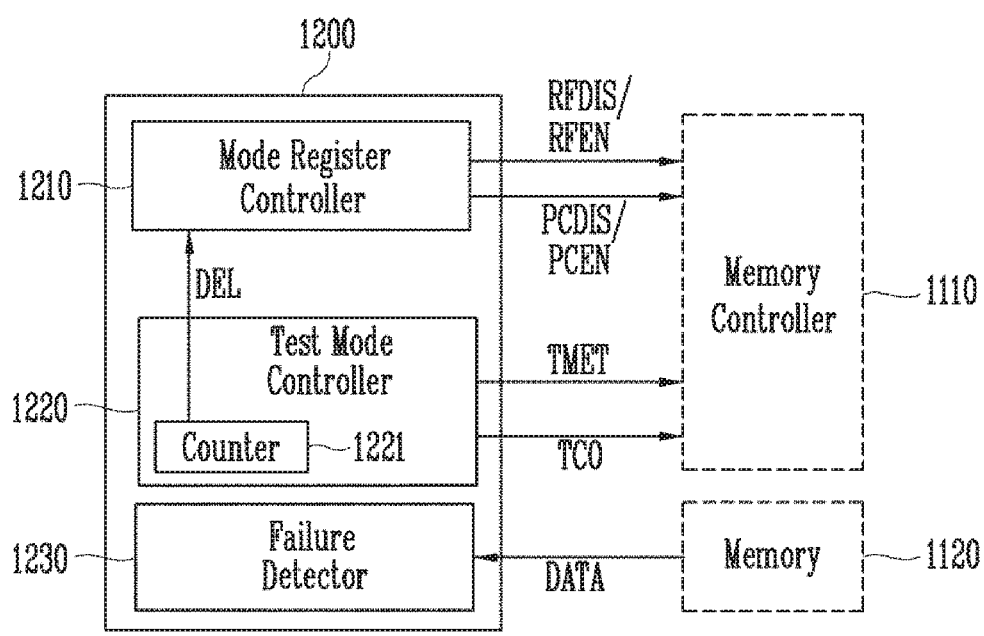
FIG. 2 is a detailed diagram of a storage device controller of FIG. 1.

FIG. 2 is a detailed diagram of the storage device controller 1200 of FIG. 1.

Referring to FIG. 2, the storage device controller 1200 may include a mode register controller 1210, a test mode controller 1220, and a failure detector 1230.

During a test operation, the mode register controller 1210 may output signals RFDIS, RFEN, PCDIS, and PCEN to the mode register (not illustrated) included in the memory controller 1110. For example, the mode register controller 1210 may selectively output a refresh disable signal RFDIS, a refresh enable signal RFEN, a precharge disable signal PCDIS, and a precharge enable signal PCEN.

The refresh disable signal RFDIS may inactivate a refresh operation of the storage device 1100, and the refresh enable signal RFEN may activate a refresh operation of the storage device 1100. The precharge disable signal PCDIS may inactivate a precharge operation of the storage device 1100, and the precharge enable signal PCEN may activate a precharge operation of the storage device 1100. The refresh operation and the precharge operation may be an operation generally performed on a DRAM device to maintain data of a memory cell.

The test mode controller 1220 may selectively output a test mode entry signal TMET and a test code signal TCO to the mode register (not illustrated) included in the memory controller 1110 during a test operation.

The test mode entry signal TMET may activate a test operation and the test code signal TCO may select a code for a desired test mode.

In addition, the test mode controller 1220 may include a counter 1221 which counts a predetermined time such that the memory controller 1110 generates a code for the test mode in response to the test code signal TCO and a power voltage is stably supplied.

The counter 1221 may selectively output a delay signal DEL for a predetermined time in response to the test code signal TCO. The delay signal DEL may serve as a signal to stop an operation of the mode register controller 1210 for a moment. For example, when the test code signal TCO is a signal for a power test, a stabilization time may be required to stably supply a power voltage for a power test to the memory controller 1110. The delay signal DEL may be output not to operate the mode register controller 1210. When the delay signal DEL is applied, the mode register controller 1210 may not output the refresh enable signal RFEN and the precharge enable signal PCEN.

The failure detector 1230 may detect failure in data DATA received from the memory 1120 during a test operation.

Figure 3:
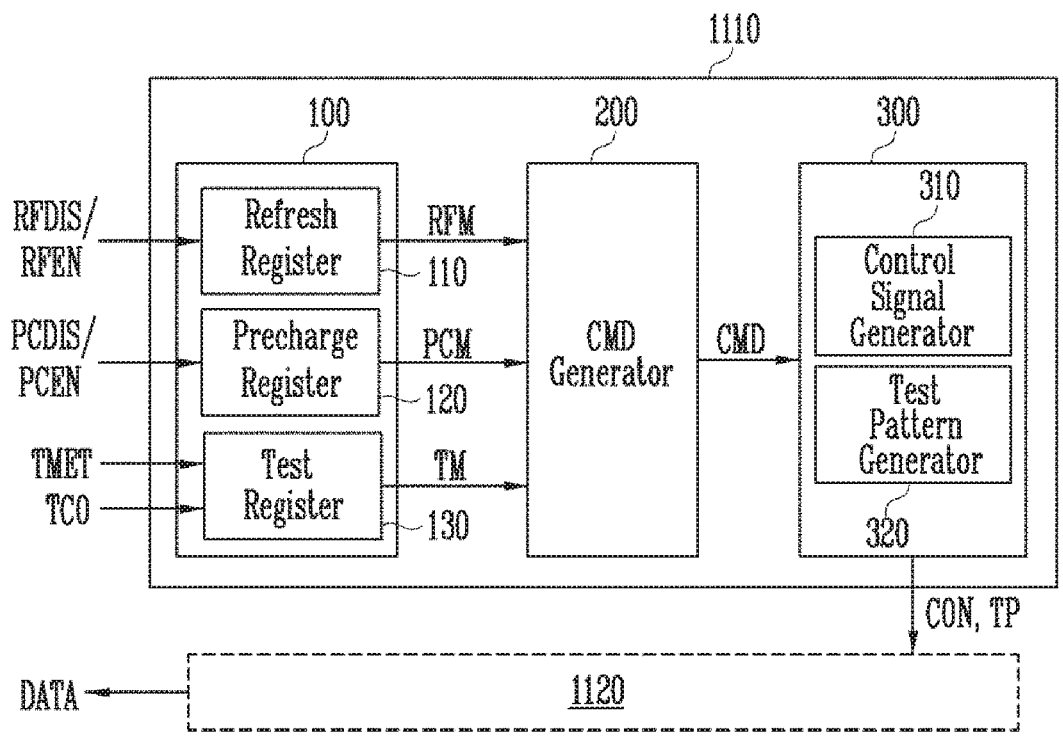
FIGS. 3 and 4 are detailed diagrams illustrating a memory controller of FIG. 1.
Figure 4:
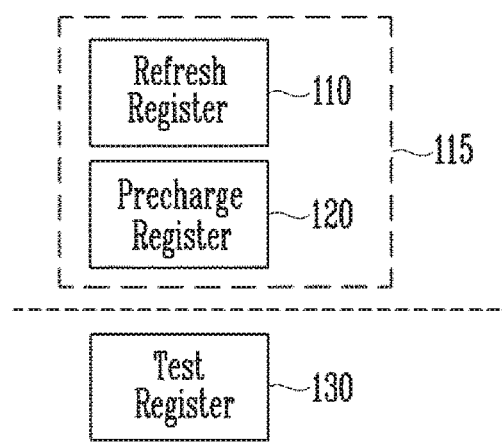

FIGS. 3 and 4 are detailed diagrams illustrating the memory controller 1110 of FIG.

Referring to FIG. 3, the memory controller 1110 may activate or inactivate various modes for the storage device 1100 in response to signals output from the storage device controller 1200, and perform a test operation on the memory 1120. The memory controller 1110 may include a mode register 100, a command (CMD) generator 200, and an operation handler 300.

The mode register 100 may store plural pieces of code regarding various operation modes, and selectively provide one among the pieces of code to the command generator 200 to activate the modes in response to the control of the storage device controller 1200. For example, the mode register 100 may include a refresh register 110, a precharge register 120, and a test register 130. The mode register 100 may further include various registers for modes other than the registers described above.

The refresh register 110 may store refresh mode code RFM. The refresh register 110 may output the refresh mode code RFM when the refresh enable signal RFEN is input, and might not output the refresh mode code RFM when the refresh disable signal RFDIS is input. According to the embodiment, the refresh mode may be an auto refresh mode.

The precharge register 120 may store precharge mode code PCM. The precharge register 120 may output the precharge mode code PCM when the precharge enable signal PCEN is input, and may not output the precharge mode code PCM when the precharge disable signal PCDIS is input. According to the embodiment, the precharge mode may be an auto precharge mode.

The test register 130 may store plural pieces of test mode code TM for the test modes. The test register 130 may be activated when the test mode entry signal TMET is input, and may output a test mode code TM selected according to the test code signal TCO.

When an auto refresh mode and an auto precharge mode are activated, interruption may occur to a test operation by the auto refresh operation or the auto precharge operation when entering and exiting a test mode for the test operation. Accordingly, according to the embodiment, registers 115 involved in auto modes may be temporarily inactivated to temporarily inactivate the refresh register operation and the precharge operation, just before entering the test mode and just before exiting the test mode.

The CMD generator 200 may output a command CMD in response to each of the refresh mode code RFM, the precharge mode code PCM, and the test mode code TM.

The CMD generator 200 may generate and output a refresh command for a predetermined time for a refresh operation when the refresh mode code RFM is received. The CMD generator 200 may generate and output a precharge command for a precharge operation when the precharge mode code PCM is received. The refresh operation may frequently adjust an electric charge that is decreased due to leakage in a DRAM cell. The precharge operation may increase the electric charge which is decreased in the DRAM cell after a read operation. The CMD generator 200 may generate and output a test command according to a received test mode when the test mode code TM is received.

The operation handler 300 may output control signals CON and a test pattern TP in response to the command CMD output from the CMD generator 200. The operation handler 300 may include a control signal generator 310 and a test pattern generator 320 that operate in response to the received command CMD.

The control signal generator 310 may generate and output the control signals CON to perform a refresh operation, a precharge operation, or a test operation in response to the command CMD. For example, the memory 1120 may include a plurality of circuits to perform operations such as a program, read, or erase operation. The control signal generator 310 may generate and output the control signals CON to operate the plurality of circuits.

The test pattern generator 320 may generate and output a pattern necessary for a test operation (hereinafter referred to as a test pattern) in response to the command CMD. For example, the test pattern may include a time delay test pattern, a logical value fix test pattern, a data change between adjacent cells test pattern, a power supply test pattern, a program, read, or erase operation failure test pattern, and the like.

The time delay test pattern may be used to check whether a response of a result value of a specific operation is delayed. The logical value fix test pattern may be used to check whether a logical value of 0 or 1 is fixed without changing in a specific circuit. The data change between adjacent cells test pattern may be used to check whether data of a selected cell is unintentionally changed when data of a cell adjacent to the selected cell is changed. The power supply test pattern may be used to check a circuit to which a power voltage is not normally supplied. In addition, the program, read, or erase operation failure test pattern may be used to check whether steps in each operation are normally performed. The test pattern may include patterns for various tests other than the patterns described above.

A test operation may be performed without coupling an external device that generates the test pattern to the memory system 1000 since the test pattern generator 320 generates and outputs the test pattern. In addition, when the external test device that generates and outputs the test pattern is coupled to the memory system 1000, a ball, a pin, or a pad for coupling the device that generates the test pattern may need to be included in a memory package. However, since the memory system 1000 is capable of generating the test pattern itself by using the test pattern generator 320, costs may be reduced by costs for including a separate ball, pin, or pad for the test operation.

The memory 1120 may perform the test operation by receiving the test pattern TP and responding to the control signals CON, and outputting the data DATA generated by the test operation to the failure detector 1230 of FIG. 2.

Figure 5:
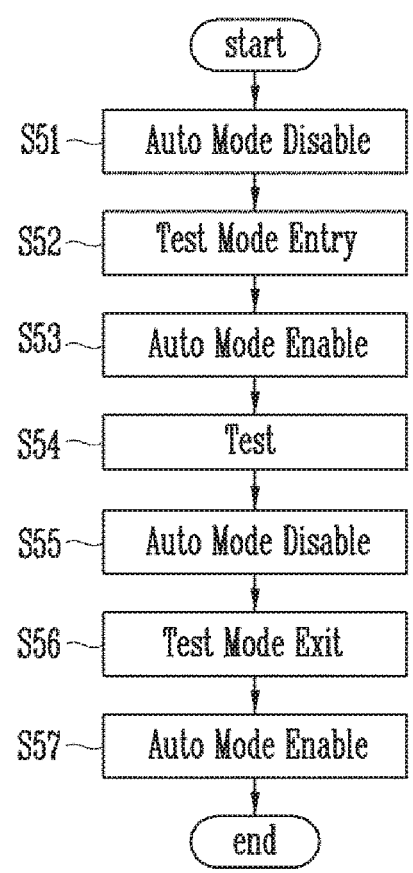
FIG. 5 is a flowchart illustrating a test operation of a memory system according to an embodiment.

FIG. 5 is a flowchart illustrating a test operation of the memory system 1000 according to an embodiment.

Referring to FIG. 5 and FIG. 2, before entering the test mode, the mode register controller 1210 may output the refresh disable signal RFDIS and the precharge disable signal PCDIS, and the memory controller 1110 may inactivate all of the auto modes in response to the refresh disable signal RFDIS and the precharge disable signal PCDIS (S51). For example, both auto refresh mode and auto precharge mode may be inactivated.

When the auto modes are inactivated, the test mode may be activated (S52). For example, the test mode controller 1220 may output the test mode entry signal TMET and the test code signal TCO. The memory controller 1110 may prepare the test mode in response to the test mode entry signal TMET and generate a test pattern in response to the test code signal TCO.

Subsequently, the mode register controller 1210 may activate the auto mode again to create a normal environment of the memory controller 1110 and the memory 1120 (S53). For example, the mode register controller 1210 may output the refresh enable signal RFEN and the precharge enable signal PCEN to activate the auto mode again.

The memory controller 1110 may perform a test operation on the memory 1120 by using the test pattern generated according to the test code signal TCO under the auto refresh mode and the auto precharge mode (S54).

When the test operation ends, the mode register controller 1210 may output the refresh disable signal RFDIS and the precharge disable signal PCDIS, and the memory controller 1110 may end the auto mode again in response to the refresh disable signal RFDIS and the precharge disable signal PCDIS (S55).

The test mode may end in a state where the auto mode ends (S56). For example, the memory controller 1110 may completely end the test mode when the refresh disable signal RFDIS and the precharge disable signal PCDIS are received after the test operation, and the refresh and precharge modes are inactivated. In other words, the storage device 1100 may exit the test mode at step S56.

When the test mode completely ends, the mode register controller 1210 may output the refresh enable signal RFEN and the precharge enable signal PCEN to the memory controller 1110 for a normal operation of the memory controller 1110 and the memory 1120 (S57). The memory controller 1110 may activate the auto mode again in response to the refresh enable signal RFEN and the precharge enable signal PCEN.

The above-described order of test operation will be described in more detail.

Figure 6:
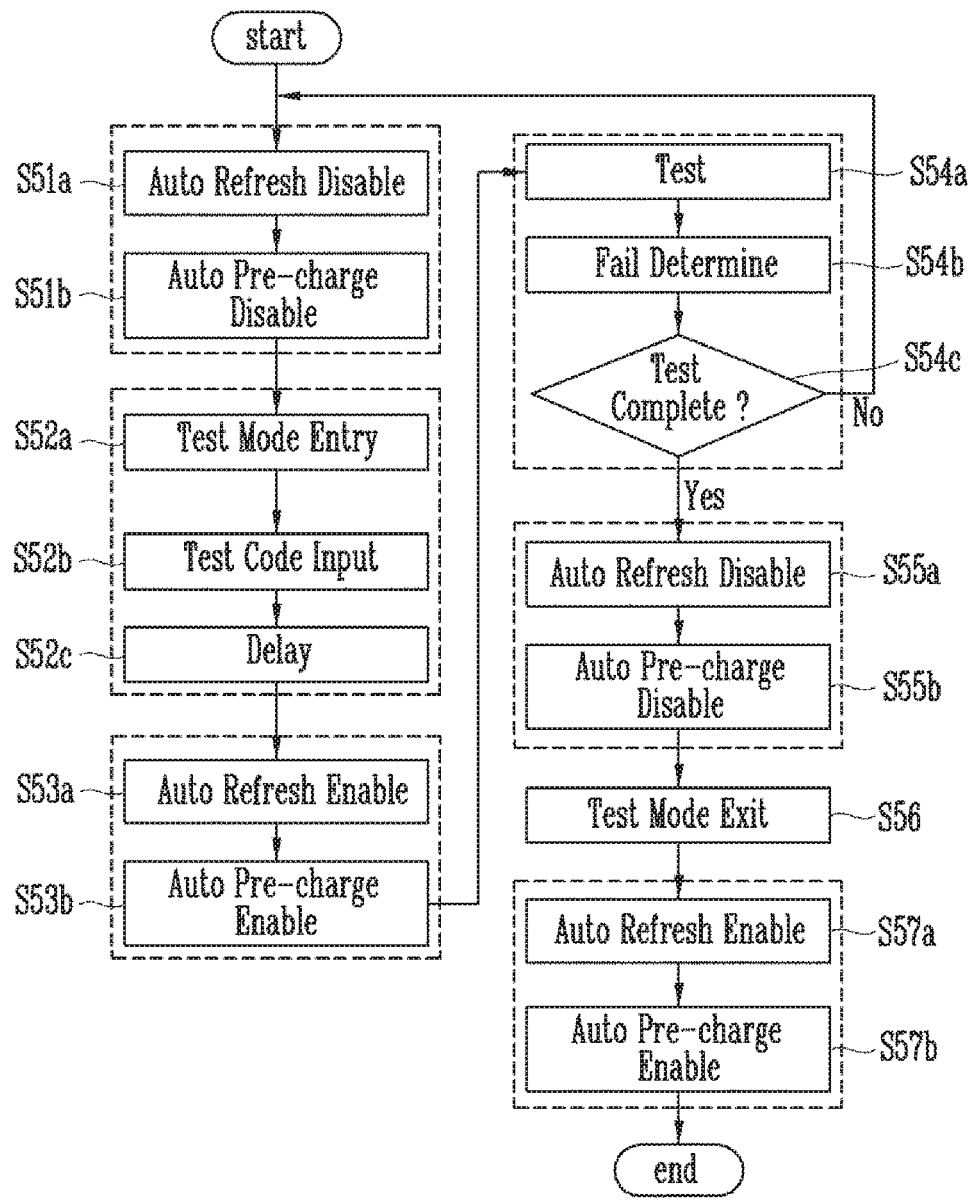
FIG. 6 is a flowchart illustrating the test operation of FIG. 5 in detail.

FIG. 6 is a flowchart illustrating the test operation of FIG. 5 in detail.

Referring to FIG. 6, FIG. 2 and FIG. 3, before entering the test mode, the auto refresh mode may be inactivated (S51*a*). For example, the mode register controller 1210 may output the refresh disable signal RFDIS to the mode register 100, and the refresh register 110 included in the mode register 100 may not output the refresh mode code RFM according to the refresh disable signal RFDIS. Since the refresh mode code RFM is not input to the CMD generator 200, the CMD generator 200 may not generate the refresh command to perform the refresh operation.

Subsequently, the auto precharge mode may be inactivated (S51*b*). For example, the mode register controller 1210 may output the precharge disable signal PCDIS to the mode register 100 and the precharge register 120 included in the mode register 100 may not output the precharge mode code PCM according to the precharge disable signal PCDIS. Since the precharge mode code PCM is not input to the CMD generator 200, the CMD generator 200 may not generate the precharge command for performing the precharge operation. The above-described steps S51*a* and S51*b* may be performed in reverse order.

When the auto modes are inactivated, to activate the test mode, the test mode controller 1220 may output the test mode entry signal TMET to the mode register 100 (S52*a*). The test register 130 may prepare the test mode according to the test mode entry signal TMET. In other words, the test register 130 may be prepared to receive the test code signal TCO when the test mode entry signal TMET is input.

The test mode controller 1220 may output the test mode entry signal TMET and may then output the test code signal TCO corresponding to a desired test to the mode register 100 (S52b). The test register 130 may output the test mode code TM according to the test code signal TCO. For example, different types of test codes may be stored in the test register 130, and the test register 130 may output the test mode code TM corresponding to the received test code signal TCO.

When the test mode code TM is output, the CMD generator 200 may generate the test command according to the test mode code TM.

When the test command is transferred to the operation handler 300, the test pattern generator 320 included in the operation handler 300 may generate the test pattern in response to the test command. When the test pattern is generated, to stably perform the test operation, the counter 1221 included in the test mode controller 1220 may generate the delay signal DEL and may output the generated delay signal DEL to the mode register controller 1210 (S52c). When the delay signal DEL is input to the mode register controller 1210, the mode register controller 1210 may not output the refresh enable signal RFEN and the precharge enable signal PCEN. For example, the delay operation S52c using the delay signal DEL may be omitted depending on types of test operations. For example, during a test operation related to a power, the delay operation S52c may be performed to stably supply a power from an external device to the storage device 1100. During a test operation related to a signal or data, the delay operation S52c may be omitted.

Subsequently, the mode register controller 1210 may output the refresh enable signal RFEN to activate the auto refresh mode (S53a) and may output the precharge enable signal PCEN to activate the auto precharge mode (S53b). The above-described steps S53a and S53b may be performed in reverse order.

When the auto mode is activated, the memory controller 1110 may generate a test pattern according to the test mode entry signal TMET and the test code signal TCO, and perform a test operation on the memory 1120 by using the generated test pattern (S54a).

The memory 1120 may output the data generated as a result of the test operation, and the failure detector 1230 may determine a result of the test operation according to the data received from the memory 1120 (S54b).

According to the determined result, when the test operation is not completed (No at step S54c), the operation may be performed again from step S51a. When it is determined that the test operation is completed (Yes at step S54c), step S55 to inactivate the auto mode again may be performed. It may be determined that the test operation is not completed in step S54c when sub-operations remain within the test operation or the test operation is to be performed again.

When the test operation is completed (Yes in step S54c), the mode register controller 1210 may output the refresh disable signal RFDIS to inactivate the refresh mode again (S55a) and may output the precharge disable signal PCDIS to inactivate the precharge mode again (S55b). The above-described steps S55a and S55b may be performed in reverse order.

When the auto mode ends, the test register 130 of the mode register 100 may not output the test mode code TM and thereby the test mode may completely end (S56), or exit the test mode.

When the test mode completely ends, the mode register controller 1210 may output the refresh enable signal RFEN to activate the refresh mode again (S57a), and output the precharge enable signal PCEN to activate the precharge mode again (S57b). The above-described steps S57a and S57b may be performed in reverse order.

Figure 7:
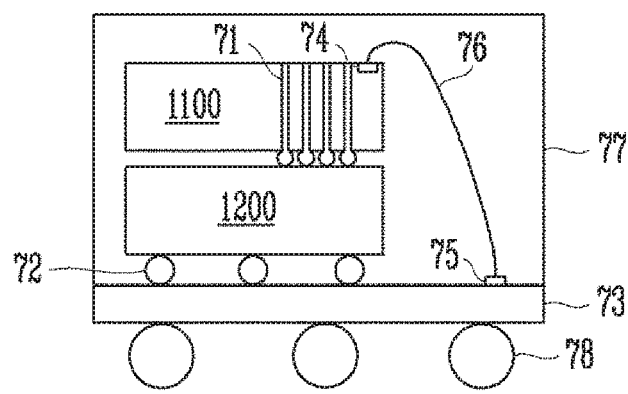
FIG. 7 is a diagram illustrating a semiconductor package according to an embodiment.

FIG. 7 is a diagram illustrating a semiconductor package 77 according to an embodiment.

Referring to FIG. 7, the semiconductor package 77 according to an embodiment may include the storage device controller 1200 and the storage device 1100 stacked on each other. For example, the storage device controller 1200 and the storage device 1100 may be coupled to each other through a through-silicon via 71 to transfer a signal and data. More specifically, a micro bump may be formed between the storage device controller 1200 and the storage device 1100, and the micro bump may be coupled to the through-silicon via 71 passing through the storage device 1100.

The storage device controller 1200 may be formed above a substrate 73. The substrate 73 and the storage device controller 1200 may be coupled to each other by a plurality of bumps 72, and a signal and data may be transferred to each other through the bumps 72.

Direct access (DA) balls 78 may be formed under the substrate 73 and the DA balls 78 may be used during a direct access test operation.

A first wafer test pad 74 may be formed on the storage device 1100 and a second wafer test pad 75 may be formed on the substrate 73. The first and second wafer test pads 74 and 75 may be used instead of the micro bumps formed under the through-silicon via 71 during the test operation. For example, since the micro bumps coupling the storage device controller 1200 and the storage device 1100 are very small, it may be difficult for a test pin for the test operation to directly access the micro bumps. Accordingly, communication between the storage device 1100 and the substrate 73 may be tested by forming the first and second wafer test pads 74 and 75 on the storage device 1100 and the substrate 73, respectively, and coupling the first and second wafer test pads 74 and 75 by a wire 76.

Figure 8:
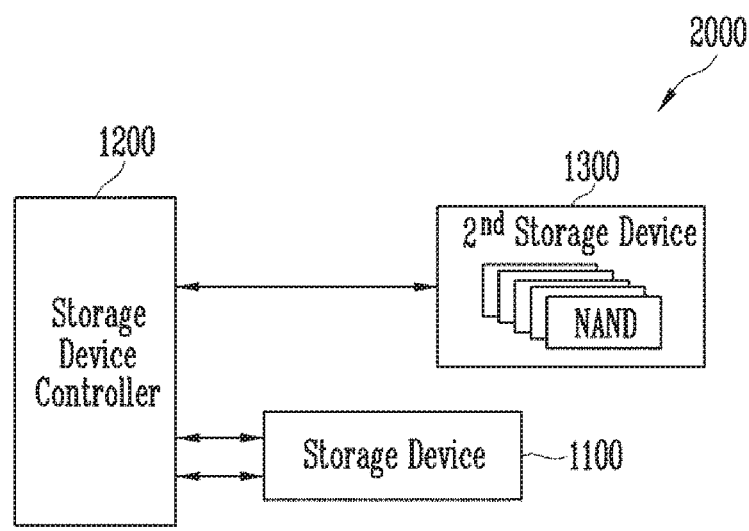
FIG. 8 is a diagram illustrating another embodiment of a memory system.

FIG. 8 is a diagram illustrating another embodiment of a memory system 2000.

Referring to FIG. 8, the memory system 2000 may further include a second storage device 1300 besides the storage device 1100 and the storage device controller 1200 described above.

The second storage device 1300 may include a plurality of NAND memories and mainly store data input by a user.

According to embodiments of the present disclosure, reliability of a test operation of a memory system may be improved by simply changing an algorithm of a test operation of the memory system.

Examples of embodiments have been disclosed herein, and although specific terms are employed, various changes in forms and details may be made to the above-described examples of embodiments without departing from the spirit and scope of the present invention. Accordingly, it will be understood by those skilled in the art that the scope of the present invention should not be limited to the above-described examples of embodiments, and may cover the scope of the following claims and their equivalents.

What is claimed is:
1. A memory system, comprising:
    a storage device including:
        a mode register suitable for storing one or more pieces of code for activating or inactivating an auto mode of a refresh operation of the storage device and a test mode;

a memory suitable for storing data; and
a storage device controller suitable for controlling the storage device to:
inactivate the auto mode;
enter the test mode when the auto mode is inactivated;
activate the auto mode when the storage device enters the test mode;
perform a test operation on the memory during the test mode;
inactivate the auto mode when the test operation is completed;
exit the test mode; and
activate the auto mode.

2. The memory system of claim 1, wherein the storage device further includes a memory controller suitable for controlling the storage device under the control of the storage device controller.

3. The memory system of claim 2, wherein the memory transfers data generated as a result of the test operation to the storage device controller.

4. The memory system of claim 2, wherein the memory controller comprises:
the mode register suitable for storing and providing the code according to the control of the storage device controller;
a command generator suitable for generating a command corresponding to one among the codes provided from the mode register; and
an operation handler suitable for selectively performing one or more among the refresh and test operations in response to the command.

5. The memory system of claim 4, wherein the mode register comprises:
a refresh register suitable for storing refresh mode code regarding a refresh mode included in the auto mode for activating the refresh operation and outputting the refresh mode code to activate the refresh mode according to the control of the storage device controller;
a precharge register suitable for storing precharge mode code regarding a precharge mode included in the auto mode for activating a precharge operation and outputting the precharge mode code to activate the precharge mode according to the control of the storage device controller; and
a test register suitable for storing a plurality of test mode codes and outputting at least one of the plurality of test mode codes to activate the test mode according to the control of the storage device controller.

6. The memory system of claim 5,
wherein the refresh register outputs the refresh mode code when a refresh enable signal output from the storage device controller is received, and
wherein the refresh register does not output the refresh mode code when a refresh disable signal output from the storage device controller is received.

7. The memory system of claim 5,
wherein the precharge register outputs the precharge mode code when a precharge enable signal is received from the storage device controller, and
wherein the precharge register does not output the precharge mode code when a precharge disable signal is received from the storage device controller.

8. The memory system of claim 5, wherein the test register outputs the test mode code when a test mode entry signal and a test code signal are received from the storage device controller.

9. The memory system of claim 4, wherein the operation handler comprises:
a test pattern generator suitable for generating a test pattern in response to the command; and
a control signal generator suitable for outputting control signals for controlling the memory in response to the command.

10. The memory system of claim 9, wherein the test pattern is selected among a time delay test pattern, a logical value fix test pattern, a data change between adjacent cells test pattern, a power supply test pattern, and a program, read, or erase operation failure test pattern of the memory.

11. The memory system of claim 1, wherein the storage device controller comprises:
a mode register controller for activating or inactivating the auto mode;
a test mode controller for activating or inactivating the test mode; and
a failure detector determining a result of the test operation.

12. The memory system of claim 11, wherein the mode register controller outputs a refresh enable signal or a refresh disable signal, and
outputs a precharge enable signal or a precharge disable signal to activate or inactivate a refresh mode and a precharge mode included in the auto mode.

13. The memory system of claim 11,
wherein the test mode controller outputs a test mode entry signal for entering the test mode, and
wherein the test mode controller outputs a test code signal corresponding to a selected test method among a plurality of test methods.

14. The memory system of claim 13, wherein the test mode controller further comprises a counter outputting a delay signal for a predetermined time after outputting the test code signal.

15. The memory system of claim 14,
wherein the delay signal is transferred to the mode register controller, and
wherein the mode register controller does not output a refresh enable signal and a precharge enable signal when the delay signal is applied.

16. A method of performing an operation of a memory system including a storage device for storing data, the method comprising:
inactivating a refresh mode and a precharge mode;
controlling the storage device to enter a test mode when the refresh mode and the precharge mode are inactivated;
activating the refresh mode and the precharge mode when the storage device enters the test mode;
controlling the storage device to perform a test operation;
inactivating the refresh mode and the precharge mode when the test operation is completed;
controlling the storage device to exit the test mode; and
activating the refresh mode and the precharge mode.

17. The method of claim 16, wherein the controlling of the storage device to enter the test mode further includes generating a test pattern after the storage device enters the test mode.

18. The method of claim 16, wherein the operation is reperformed from the inactivating of the refresh mode and the precharge mode, when the test operation of the storage device is not completed or a test operation other than the test operation is further performed during the performing of the test operation of the storage device.

19. A test method of a DRAM device, the test method comprising:
   controlling the DRAM device to enter a test mode;
   controlling the DRAM device to perform a test operation thereto during the test mode; and
   controlling the DRAM device to exit the test mode,
   wherein the DRAM device temporarily inactivates refresh and precharge operations at the entry into and the exit from the test mode.

* * * * *